(12) United States Patent
Chen et al.

(10) Patent No.: US 11,508,816 B2
(45) Date of Patent: Nov. 22, 2022

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Te-An Chen, Taichung (TW); Meng-Han Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/192,607

(22) Filed: Mar. 4, 2021

(65) Prior Publication Data

US 2022/0285496 A1    Sep. 8, 2022

(51) Int. Cl.
*H01L 29/10* (2006.01)
*H01L 21/76* (2006.01)
*H01L 21/265* (2006.01)
*H01L 21/762* (2006.01)
*H01L 29/78* (2006.01)

(52) U.S. Cl.
CPC .... *H01L 29/1054* (2013.01); *H01L 21/26513* (2013.01); *H01L 21/76224* (2013.01); *H01L 29/78* (2013.01)

(58) Field of Classification Search
CPC ... H01L 29/10; H01L 29/105; H01L 29/1054; H01L 29/78; H01L 21/26; H01L 21/265; H01L 21/2651; H01L 21/26513; H01L 21/76; H01L 21/762; H01L 21/7622; H01L 21/76224
USPC .......................................................... 257/402
See application file for complete search history.

(56) References Cited

U.S. PATENT DOCUMENTS 9,299,702 B2*    3/2016    Saha ............... H01L 21/823878
2012/0267724 A1*    10/2012    Venkatesan ......... H01L 29/7833
257/402

* cited by examiner

*Primary Examiner* — Monica D Harrison
(74) *Attorney, Agent, or Firm* — WPAT Law; Anthony King

(57) ABSTRACT

The present disclosure provides a semiconductor structure. The semiconductor structure includes a substrate including a well region and an adjustment region over the well region. An isolation structure is disposed over the substrate and at least partially surrounds the well region and the adjustment region. An epitaxial layer is disposed over the adjustment region and surrounded by the isolation structure. A gate structure is disposed on the epitaxial layer. The present disclosure also provides a method for forming a semiconductor structure.

20 Claims, 18 Drawing Sheets

SEMICONDUCTOR STRUCTURE AND METHOD OF FORMING THE SAME

BACKGROUND

Semiconductor structures are used in a variety of electronic applications, such as personal computers, cellular telephones, digital cameras, and other electronic equipment. Semiconductor structures are typically fabricated by sequentially depositing insulating or dielectric layers, conductive layers, and semiconductive layers of material over a semiconductive substrate, and patterning the various material layers using lithography to form circuit components and elements thereon.

The semiconductor industry continues to increase the integration density of various electronic components (e.g., transistors, diodes, resistors, capacitors, etc.) by achieving continual reductions in minimum feature size, which allow more components to be integrated into a given area.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
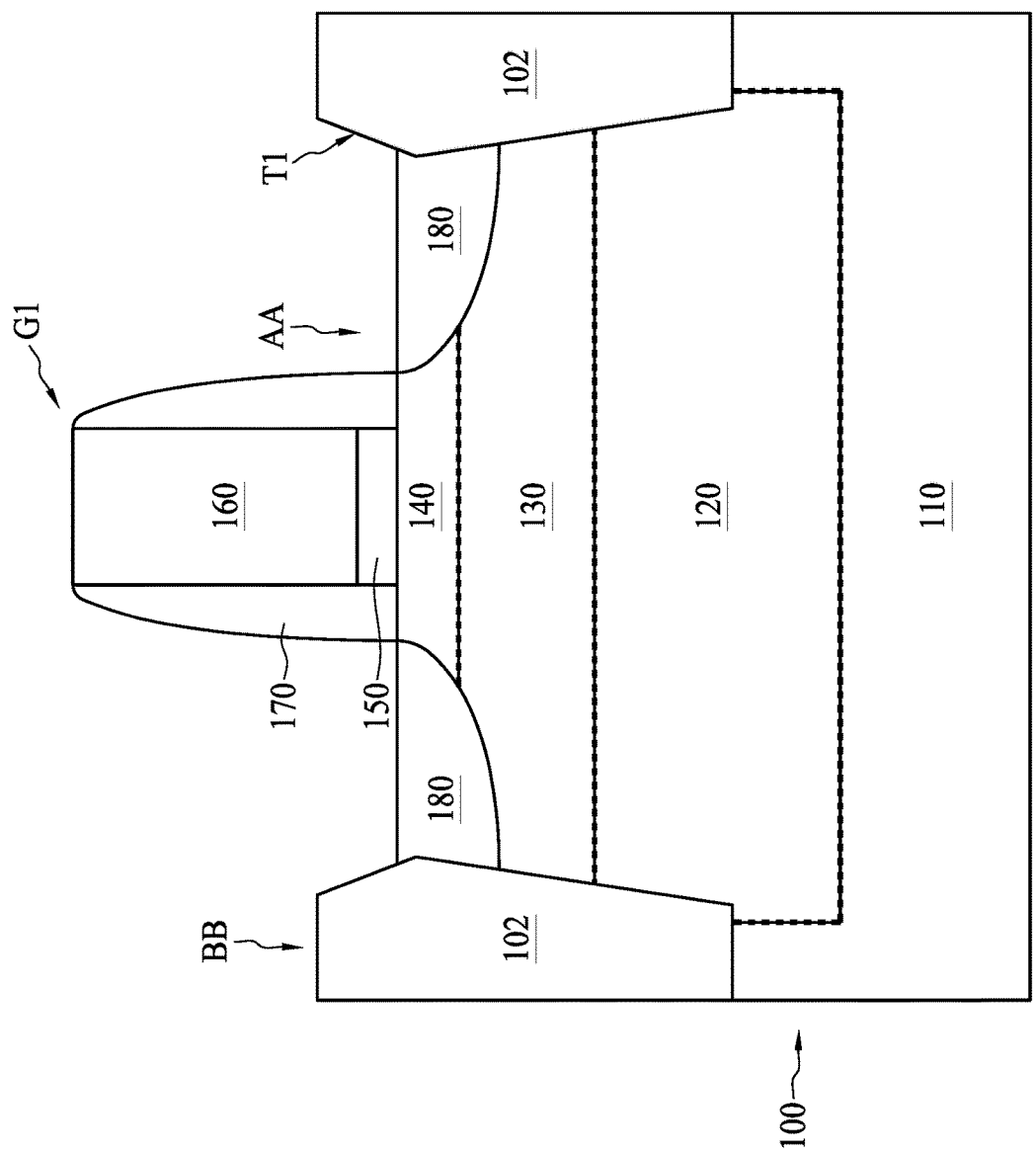
FIG. 1 is a schematic cross-sectional view showing a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass orientations of the device in use or operation in some embodiments different from the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In field-effect transistors (FET), carrier mobility is temperature-sensitive. For example, the mobility of electrons in channel regions of an n-type field-effect transistor (NFET) has been observed to be inversely proportional to temperature. Similarly, changes in the mobility of holes in channel regions of a p-type field-effect transistor WITT) have also been observed to be inversely proportional to temperature. Since carrier mobility directly affects driving current for driving a transistor, temperature effects on the carrier mobility have to be taken into account when fabricating the transistor.

The present disclosure is directed to a semiconductor structure which has an epitaxial layer disposed between a doped region and a gate structure of the semiconductor structure. Implantation is crucial to the formation of the doped region (i.e., a well region and an adjustment region) in an active region of a substrate. At a deep position of the active region, the well region is a region full of high-energy impurity atoms. The well region can increase the breakdown voltage and prevent transient voltages from accumulation that causes a latch-up effect. The adjustment region is over the well region and functions as a threshold voltage adjustment layer for a parasitic field transistor by using a selected concentration profile of impurity atoms. To reduce impurity scattering, a region near a top surface of the active region has a concentration of impurity atoms as low as possible.

However, because an annealing process is required for repairing defects caused by the implantation processes and electrically activating impurity atoms in the doped regions, longitudinal diffusion of the impurity atoms to the region near the top surface of the active region is inevitable. With an increase of impurity atoms in the region near the top surface of the active region, impurity scattering in the above-mentioned adjustment region becomes severe.

The semiconductor structure provided by the present disclosure includes the epitaxial layer that prevents the gate structure from being in direct contact with the doped region. The epitaxial layer is formed after the well implantation and the threshold voltage adjustment implantation and before the formation of the gate structure. Because the epitaxial layer is a freshly-grown layer free of any dopant or impurity atoms, the epitaxial layer can isolate the gate structure thereon from being influenced by impurity scattering. By virtue of disposing the epitaxial layer between the doped region and the gate structure, degradation of carrier mobility in a device based on the semiconductor structure can be prevented. Because the carrier mobility remains at a high level, the driving current can be increased and the device performance can be improved.

FIG. 1 is a schematic cross-sectional view showing a semiconductor structure P10, in accordance with some embodiments of the present disclosure. In some embodiments, the semiconductor structure P10 is a metal-oxide-semiconductor field-effect transistor (MOSFET). In some embodiments, the semiconductor structure P10 includes a substrate 100, which can be a silicon (Si) wafer. In some embodiments, an isolation structure 102 is disposed over the substrate 100 and divides the substrate 100 into an active region AA and an isolation region BB surrounding the active region AA. In some embodiments, the isolation structure 102 is a shallow trench isolation (STI). In some embodiments, a top surface of the isolation region BB may be higher than a top surface of the active region AA. In some embodiments, the active region AA is located in a trench T1 surrounded by the isolation structure 102.

In some embodiments, the substrate 100 includes a bulk region 110, a well region 120 disposed over the bulk region 110, and an adjustment region 130 disposed over the well region 120. In some embodiments, the isolation structure 102 is disposed over the bulk region 110. In some embodiments, the bulk region 110 is made of a monolithic block of silicon or single crystalline silicon. Alternatively, the bulk region 110 is silicon on insulator (SOI), which has a low parasitic capacitance. In alternative embodiments, the bulk region 110 includes compound semiconductors such as silicon germanium (Site). In some embodiments, the bulk region 110 is made of dopant-free silicon and has substantially zero concentration of impurity atoms.

In some embodiments, the well region 120 is disposed at a predetermined depth of the active region AA. In some embodiments, the well region 120 and the adjustment region 130 include dopants. In some embodiments, the well region 120 and the adjustment region 130 are at least partially surrounded by the isolation structure 102. In some embodiments, when the semiconductor structure PPO is an n-channel MOS (NMOS) transistor, the well region 120 is a p-type well and the adjustment region 130 is a p-type region. In such embodiments, the well region 120 and the adjustment region 130 include p-type impurity atoms such as boron (B), gallium. (Ga) or indium (In). In some embodiments, when the semiconductor structure P10 is a p-channel MOS (PMOS) transistor, the well region 120 is an n-type well and the adjustment region 130 is an n-type region. In such embodiments, the well region 120 and the adjustment region 130 include n-type impurity atoms such as phosphorus (P) or arsenic (As).

In some embodiments, an epitaxial layer 140 is disposed on the substrate 100 and a gate structure G1 is disposed over the epitaxial layer 140. In some embodiments, the epitaxial layer 140 and the gate structure G1 are disposed in the active region AA and surrounded by the isolation structure 102. In some embodiments, the epitaxial layer 140 includes a monolithic block of silicon or single crystalline silicon. In other embodiments, the epitaxial layer 140 can be silicon germanium. In some embodiments, the epitaxial layer 140 has a thickness between about 15 and about 60 angstroms (Å). In some embodiments, the epitaxial layer 140 has substantially zero concentration of impurity atoms, the well region 120 includes a high concentration of impurity atoms, and the adjustment region 130 includes a medium concentration of impurity atoms compared to the epitaxial layer 140 and the well region 120. In some embodiments, the epitaxial layer 140 has substantially the same concentration of impurity atoms as the bulk region 110. In some embodiments, the well region 120 has substantially higher concentration of impurity atoms than the bulk region 110. In some embodiments, the adjustment region. 130 has substantially higher concentration of impurity atoms than the bulk region 110.

In some embodiments, the gate structure G1 includes a gate dielectric 150, a gate conductor 160 and a gate spacer 170. In some embodiments, the gate dielectric 150 is disposed on the epitaxial layer 140. The gate conductor 160 is disposed on the gate dielectric 150. The gate spacer 170 is disposed on the epitaxial layer 140 and surrounds the gate dielectric 150 and the gate conductor 160. In some embodiments, the gate spacer 170 and the gate dielectric 150 are in direct contact with the epitaxial layer 140 and cover at least a portion of the epitaxial layer 140. In some embodiments, the thickness of the epitaxial layer 140 is substantially greater than a thickness of the gate dielectric 150.

In some embodiments, a source/drain (S/D) region 180 is disposed in the active region AA and on opposite sides of the gate structure G1. In some embodiments, the S/D region 180 extends longitudinally from the top surface of the epitaxial layer 140 to a predetermined depth of the adjustment region 130. In some embodiments, the bottom-most surface of the S/D region 180 is positioned about halfway between top and bottom surfaces of the adjustment region 130. In some embodiments, the S/D region 180 is disposed in portions of the epitaxial layer 140 and the adjustment region 130, In other embodiments, the S/D region 180 is only disposed in portions of the epitaxial layer 140. In both embodiments, a portion of the epitaxial layer 140 beneath the gate structure G1 and surrounded by the S/D region 180 is free of impurity atoms.

In some embodiments, the gate spacer 170 separates the S/D region 180 from the gate dielectric 150 and the gate conductor 160. In some embodiments, when the semiconductor structure P10 is an NMOS transistor, the S/D region 180 is an n-type region over the well region 120 (a p-type well). In some embodiments, when the semiconductor structure P10 is a PMOS transistor, the S/D region 180 is a p-type region over the well region 120 (an n-type well). In some embodiments, the semiconductor structure P10 is substantially a transistor in which the gate structure G1 serves as a gate terminal of the transistor and the S/D region 180 serves as a source terminal and a drain terminal of the transistor. In some embodiments, a channel region (not shown) is between the S/D region 180 and at an interface of the epitaxial layer 140 and the gate dielectric 150.

Figure 2:
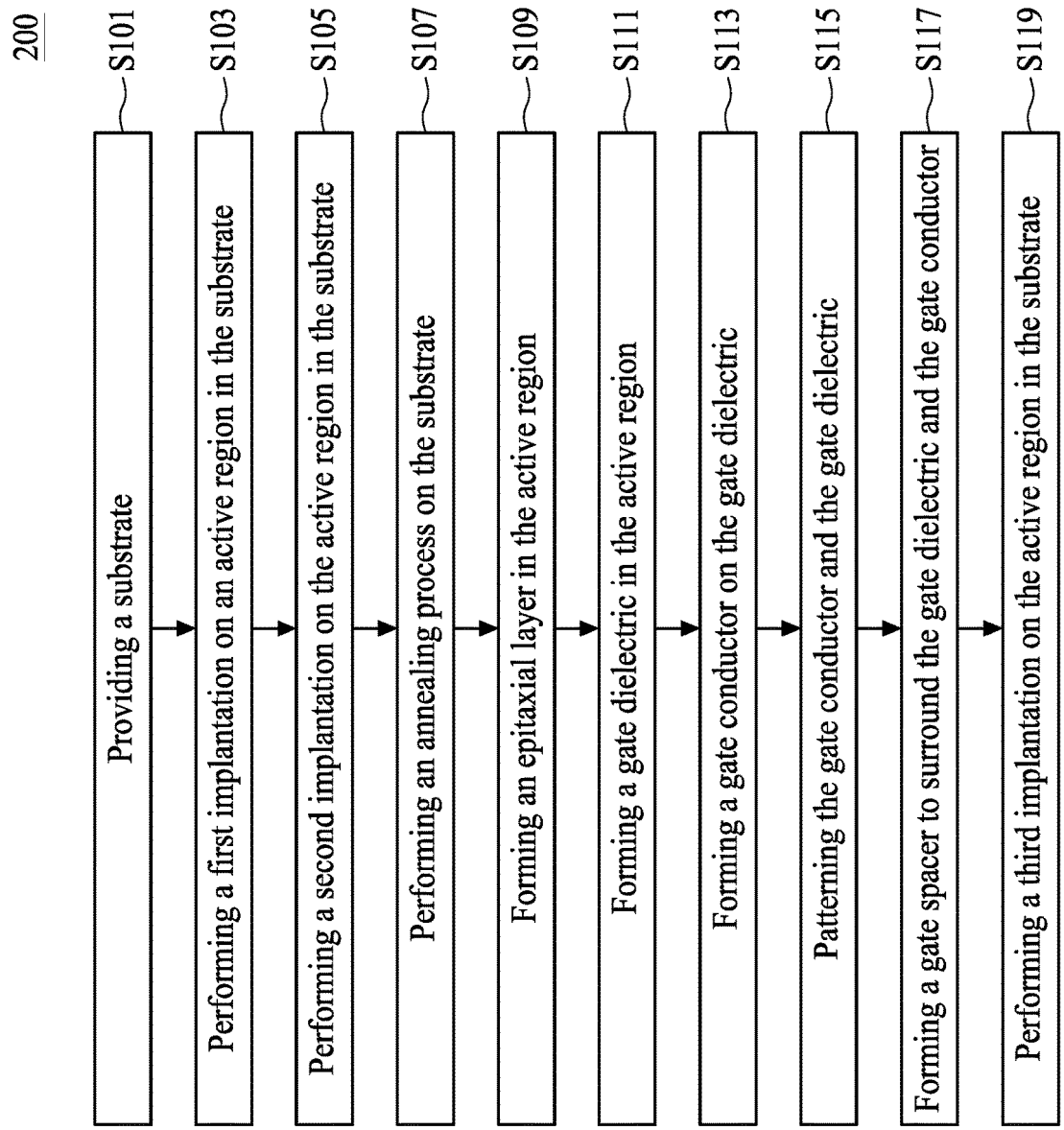
FIG. 2 is a flowchart illustrating a method for fabricating the semiconductor structure in FIG. 1, in accordance with some embodiments of the present disclosure.

FIG. 2 is a flowchart illustrating a method 200 for fabricating a semiconductor structure, in accordance with some embodiments of the present disclosure, FIGS. 3, 4, 6, 9 and 11 to 18 are schematic cross-sectional views illustrating sequential fabrication stages of the semiconductor structure P10 in FIG. 1 using the method 200 in FIG. 2, in accordance with some embodiments of the present disclosure. FIGS. 5, 7, 8 and 10 schematic graphs depicting the concentration of dopant ions with respect to the depth of the substrate.

Figure 3:
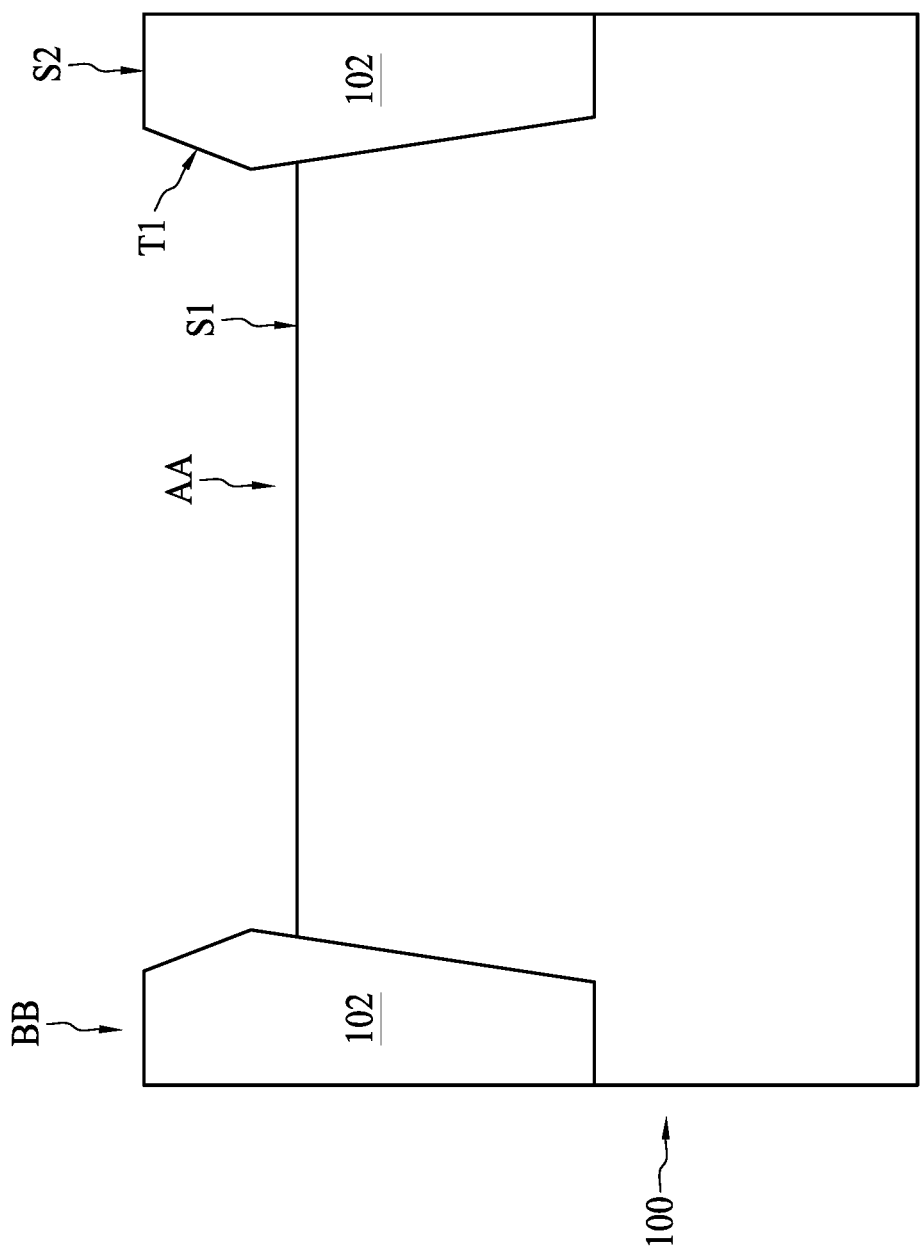
FIGS. 3, 4, 6, 9 and 11 to 18 are schematic cross-sectional views illustrating sequential fabrication stages of the semiconductor structure in FIG. 1 using the method in FIG. 2, in accordance with some embodiments of the present disclosure.

In operation S101, a substrate 100 is provided as shown in FIG. 3. In some embodiments, the substrate 100 includes an active region AA surrounded by an isolation region BB. In some embodiments, the active region AA is an oxide definition (OD) region that has a top surface S1. In some embodiments, the isolation region BB is a shallow trench isolation (STI) structure. In some embodiments, an isolation structure 102 may be formed by removing some portions of the substrate 100 to form a trench T1 in the substrate 100, and then filling the trench with a dielectric material such as silicon oxide ($SiO_2$), undoped silicate glass (USG) or any suitable dielectric material. In some embodiments, after the trench T1 is filled with the dielectric material, the active region AA can be recessed such that a top surface S2 of the isolation region. BB is higher than the top surface S1 of the active region AA.

Figure 4:
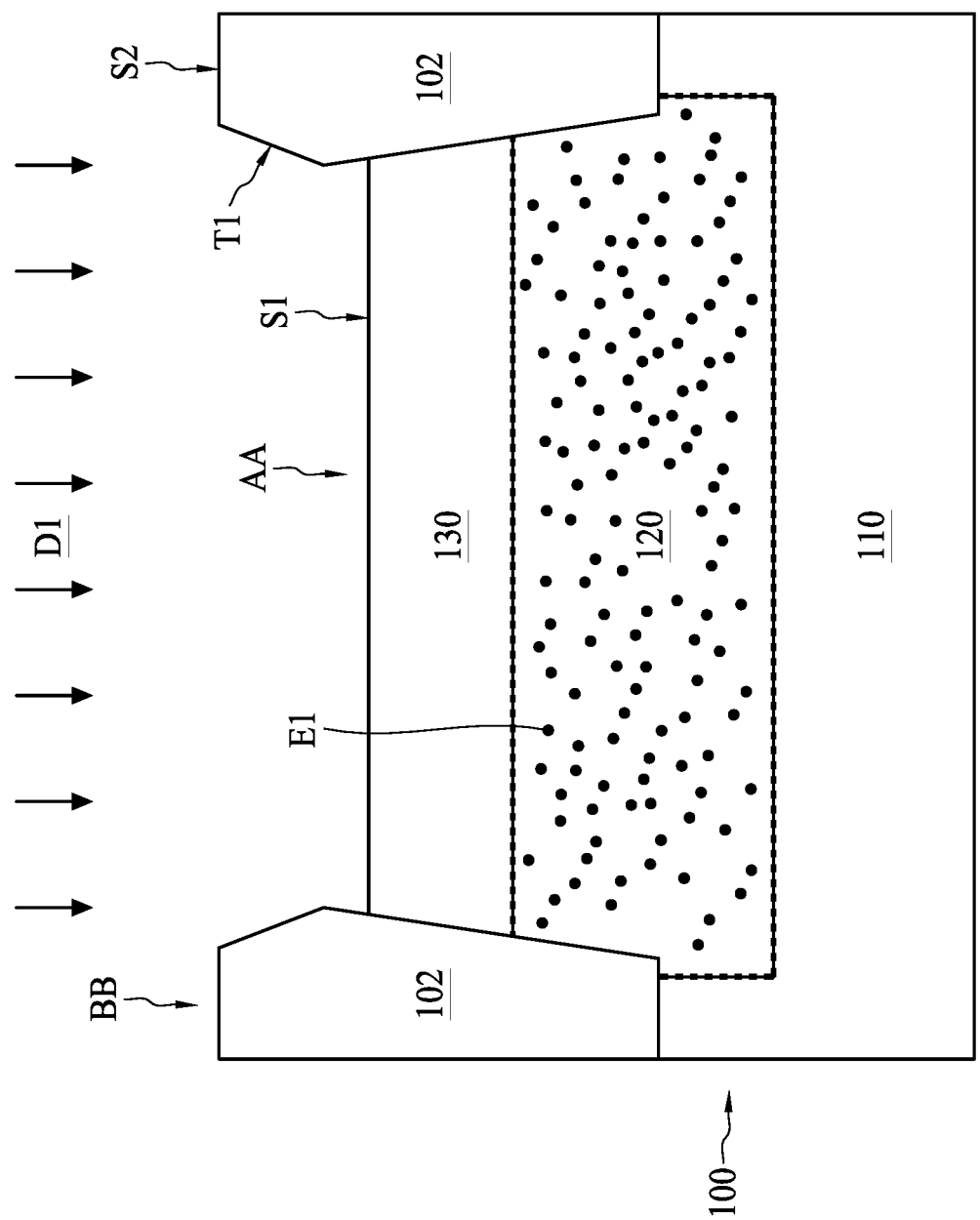

In operation S103, a first implantation is performed on the active region AA in the substrate 100 as shown in FIG. 4. In some embodiments, a photomask may be disposed to cover the isolation region BB and expose only the active region AA. In some embodiments, first dopant ions D1 may be implanted into the active region AA to form a well region 120 at a predetermined region of the substrate 100. In some embodiments, the implanted first dopant ions D1 form multiple first impurity atoms E1 in the well region 120.

In some embodiments, the first implantation is used to form a p-type well in the well region 120 when the first dopant ions D1 include p-type dopant ions such as boron (B), gallium (Ga) or indium (In). In such embodiments, the p-type well is for an NMOS transistor in which electrons are the majority carrier. In other embodiments, the first implantation is used to form an n-type well in the well region 120 when the first dopant ions D1 include n-type dopant ions such as phosphorus (P) or arsenic (As). In such embodiments, the n-type well is for a PMOS transistor in which electron holes are the majority carrier.

Figure 5:
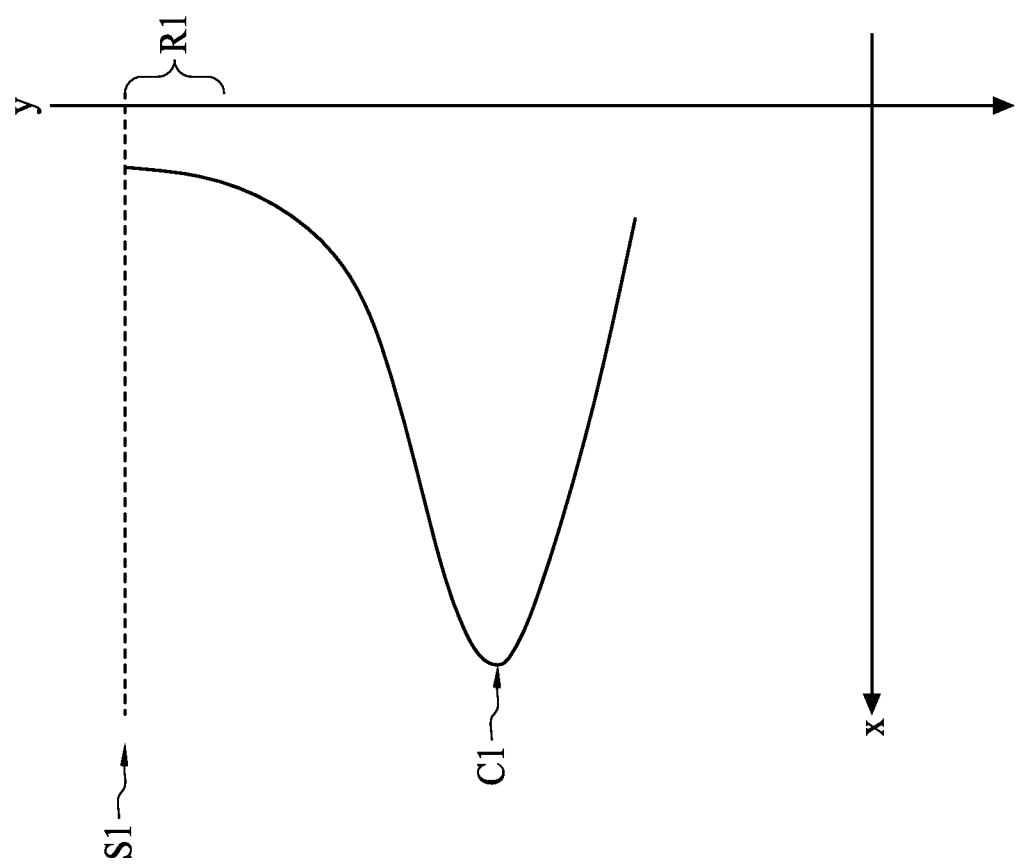
FIGS. 5, 7, 8 and 10 are schematic graphs depicting the concentration of impurity atoms with respect to the depth of the substrate after different operations, in accordance with some embodiments of the present disclosure.

FIG. 5 is a schematic graph depicting concentration of impurity atoms with respect to position in the substrate after the operation S103, in accordance with some embodiments of the present disclosure. The concentration of impurity atoms is plotted on the x axis, and distance from a top surface of the substrate 100 is plotted on the y axis, i.e., the distance from the top surface S1 of the active region AA. In some embodiments, after the first dopant ions D1 are implanted into a preselected region of the substrate 100, the first impurity atoms E1 form a non-uniform distribution of concentration in a doped region. A curve C1 depicts a concentration profile of the first impurity atoms E1 in relation to distance from a top surface of the substrate 100. In some embodiments, the concentration profile of first impurity atoms E1 follows a Gaussian distribution, as shown in FIG. 5.

Due to differences in the concentration at different depths in the substrate, the first impurity atoms E1 may longitudinally diffuse from a high-concentration region to a low-concentration region within the active region AA. In some embodiments, a region R1 proximal to the top surface S1 of the active region AA, i.e., a channel region on which a gate structure will subsequently be formed, has a relatively low concentration of the first impurity atoms E1 because it is farther from the doped region.

In some embodiments, the first implantation is used to enhance conductivity in the active region AA and increase the breakdown voltage of the active region AA. In some embodiments, the first implantation is a high-energy implantation that forms a low-resistance region deep in the active region AA, i.e., the well region 120. The low-resistance region keeps the voltage near to ground everywhere in the well region 120 and prevents accumulation of transient voltages that may cause a latch-up effect.

However, an implantation may also bring about impurity scattering that restricts the mobility of carriers. The term "impurity scattering" refers to that carriers may be scattered as they pass through a region with impurity atoms. When the carriers pass through the region with impurity atoms, an electrostatic interaction such as a Coulomb force is generated between the carriers and the impurity atoms. Therefore, the carriers and the impurity atoms can be mutually attractive or repulsive such that directions of the carriers' motion will change. The amount of impurity scattering due to electrostatic forces between the carriers and the impurity atoms depends on the interaction time and the number of impurities, A device implanted with a greater concentration of dopant ions has a greater concentration of impurity atoms and becomes more likely to suffer from the impurity scattering. The impurity scattering will significantly degrade the carrier mobility, thus reducing the driving current in a device and heavily degrading the device performance, Due to the above factors, in some embodiments, the region R1 proximal to the top surface S1 of the active region AA is configured to have as low a concentration of the first impurity atoms E1 as possible.

Figure 6:
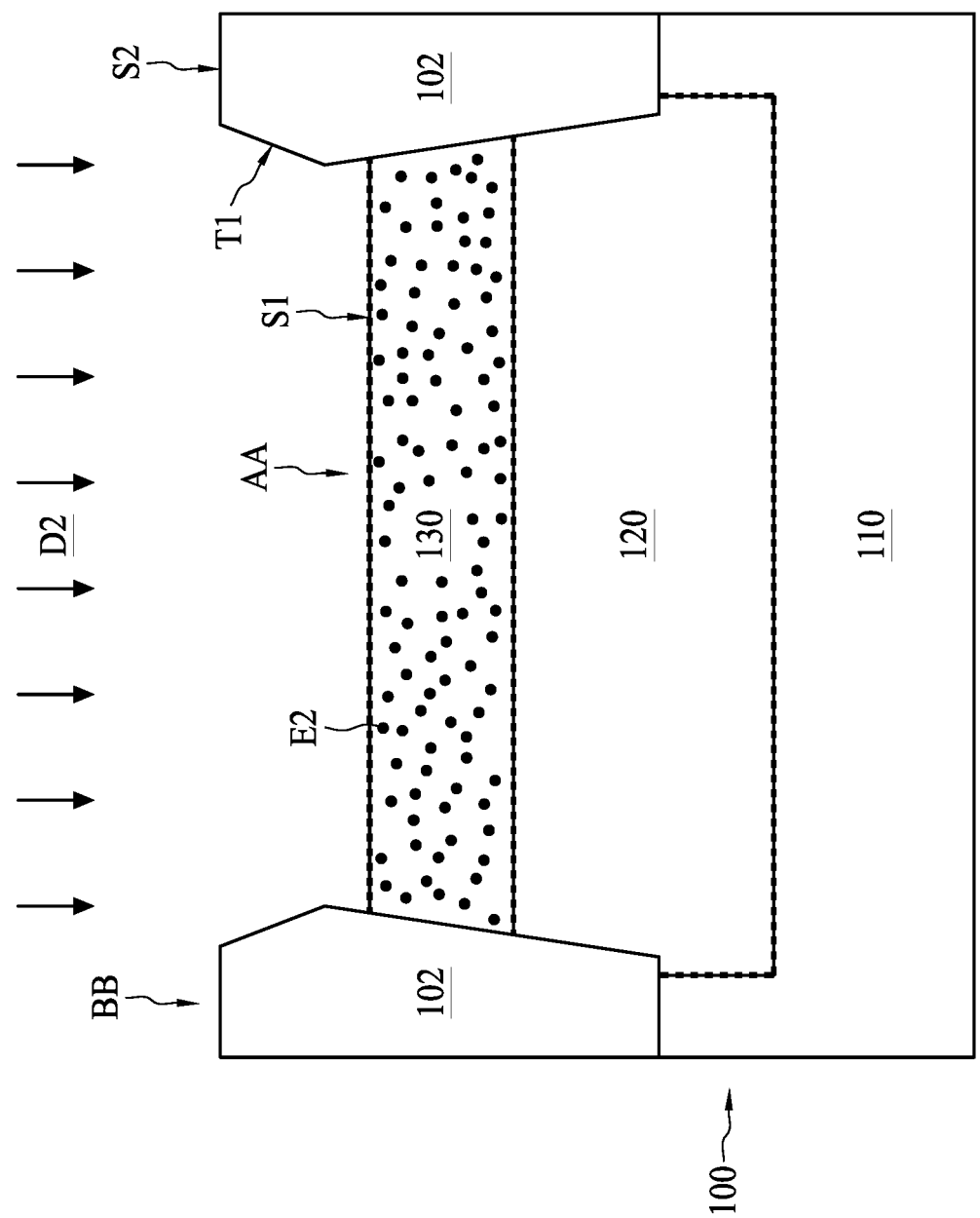

In operation S105, a second implantation is performed on the active region AA in the substrate 100 as shown in FIG. 6. Second dopant ions D2 may be implanted into the active region AA to form an adjustment region 130 in a predetermined region of the substrate 100. In some embodiments, the implanted second dopant ions D2 form multiple second impurity atoms E2 in the adjustment region 130. In some embodiments, the adjustment region 130 is disposed over the well region 120. In other embodiments, the adjustment region 130 may partially overlap the well region 120 in a longitudinal direction.

In some embodiments, the well region 120 and the adjustment region 130 are at least partially surrounded by the isolation region BB. In some embodiments, the adjustment region 130 is a p-type region when the well region 120 is a p-type well. In such embodiments, the second dopant ions D2 include p-type dopant ions. In other embodiments, the adjustment region 130 is an n-type region when the well region 120 is an n-type well. In such embodiments, the second dopant ions D2 include n-type dopant ions. After the formation of the adjustment region 130, the photomask is removed.

Figure 7:
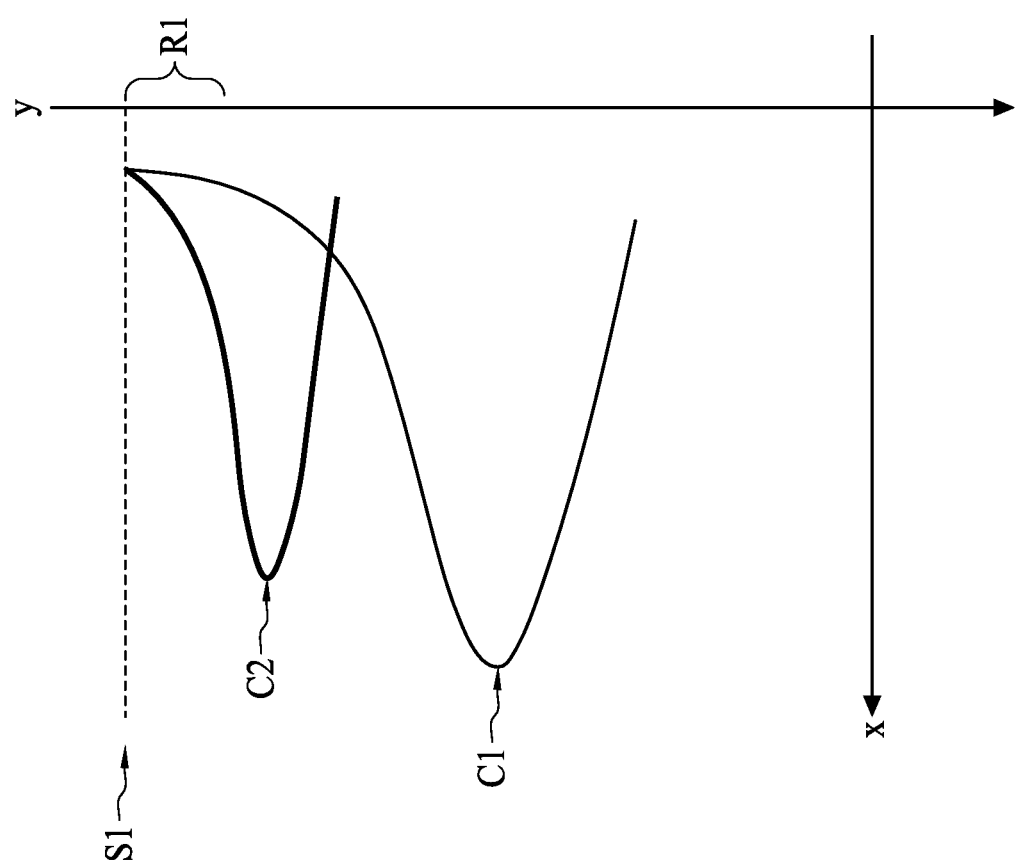

FIG. 7 is a schematic graph depicting concentrations of impurity atoms with respect to position in the substrate after the operation S105, in accordance with some embodiments of the present disclosure. In some embodiments, after the second dopant ions D2 are implanted into a preselected region of the substrate 100, the second impurity atoms E2 form a non-uniform distribution of concentration in the doped region. A curve C2 depicts a concentration profile of the second impurity atoms E2 in relation to distance from a top surface of the substrate 100. In some embodiments, the concentration profile of the second impurity atoms E2 follows a Gaussian distribution, as shown in FIG. 7.

Due to differences in the concentration at different depths in the substrate, the second impurity atoms E2 may longitudinally diffuse from a high-concentration region to a low-concentration region within the active region AA. In some embodiments, the region R1 proximal to the top surface S1 of the active region AA has a relatively low concentration of the second impurity atoms E2 because it is farther from the doped region. In some embodiments, the second implantation is used to achieve a preferred turn-on voltage, i.e., a threshold voltage ($V_T$), for a parasitic field transistor by using a selected concentration profile of impurity atoms.

In some embodiments, the second implantation is a low-energy implantation that dopes the surface of the active region AA. The low-energy implantation is a voltage adjustment implantation that sets the turn-on voltage of the transistor to be formed. In some embodiments, the turn-on voltage of a parasitic PMOS or NMOS transistor may be increased so that it will not be turned on during operation. To reduce impurity scattering, in some embodiments, the region R1 proximal to the top surface S1 of the active region. AA is configured to have as low a concentration of the second impurity atoms E2 as possible.

In operation S107, an annealing process is performed on the substrate 100, During the implantation, the dopant ions in lattices of the semiconductor substrate may have some defects such as interstitials. In some embodiments, the annealing process is performed to repair defects caused by the first implantation and the second implantation. In some embodiments, the annealing process may electrically activate the first impurity atoms E1 and the second impurity atoms E2 within the active region AA because the conductivity and carrier mobility of a doped semiconductor are dependent on its temperature.

Figure 8:
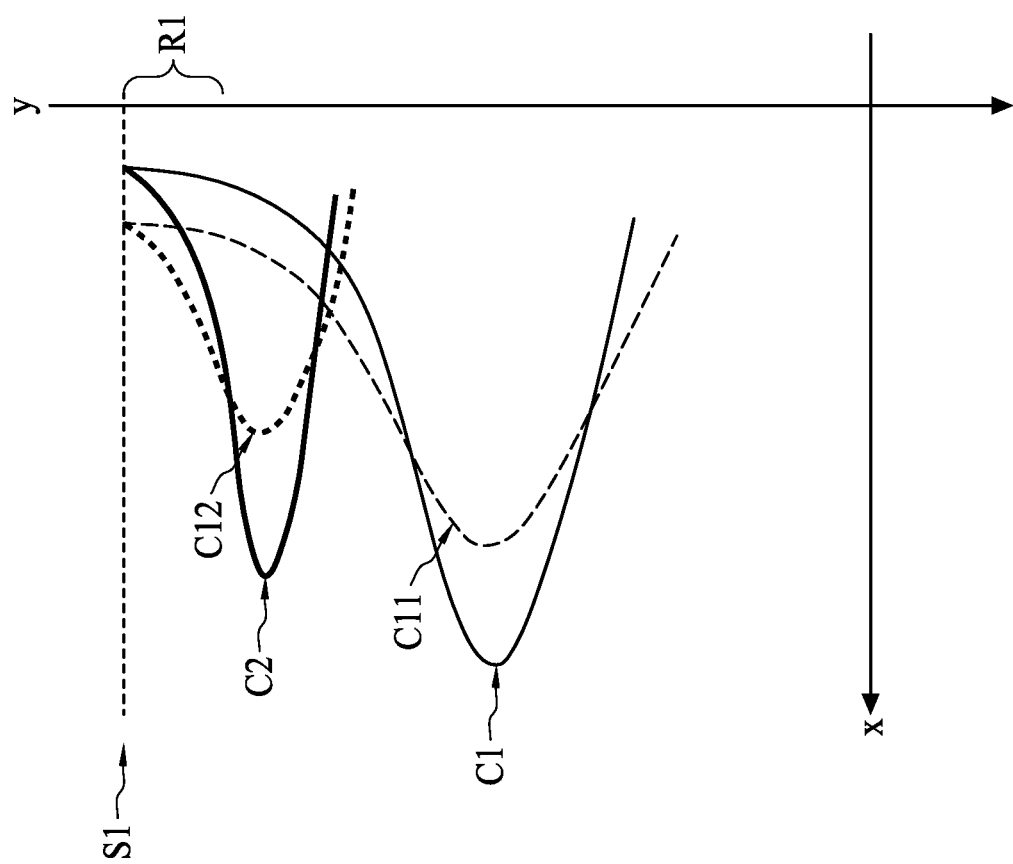

FIG. 8 is a schematic graph depicting concentrations of impurity atoms with respect to position in the substrate after the operation S107, in accordance with some embodiments of the present disclosure. Although the annealing process can repair damage caused by implantation, raising the temperature will cause the impurity atoms to diffuse. Therefore, a longitudinal diffusion of the impurity atoms will result in broadening of the curves C1 and C2. Curves C11 and C12 respectively depict a concentration profile from the curves C1 and C2 after the annealing process. At such, concentrations of the first impurity atoms E1 and the second impurity atoms E2 in the region R1 proximal to the top surface S1 of the active region AA are increased. With the increase of impurity atoms in the region R1, impurity scattering in the region R1 becomes more severe.

Figure 9:
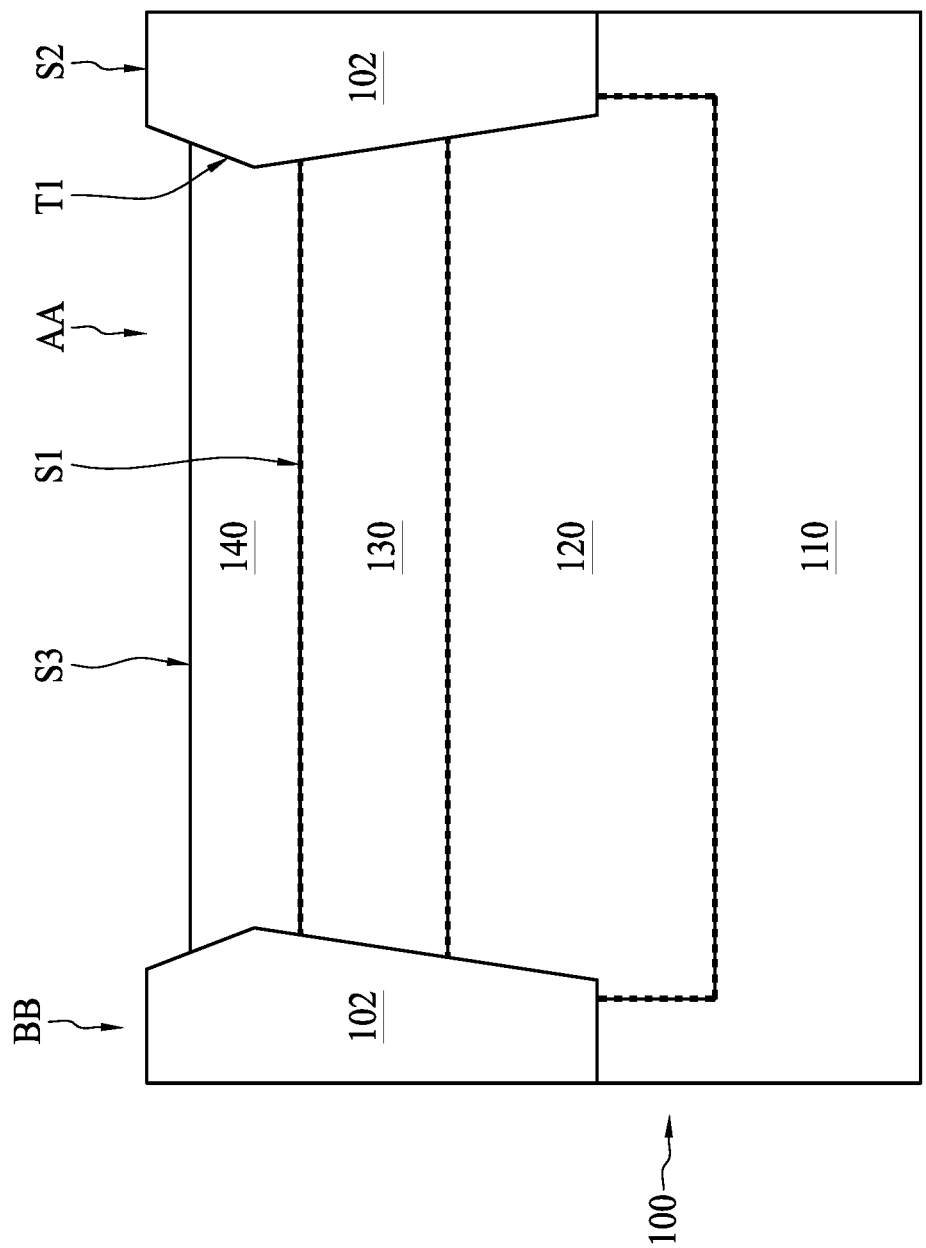

In operation S109, an epitaxial layer 140 is formed in the active region AA as shown in FIG. 9. In some embodiments, the epitaxial layer 140 is formed using an epitaxial growth process, wherein the epitaxial layer 140 is grown on the well-defined surface of the silicon substrate 100. In some embodiments, the epitaxial layer 140 does not grow on a dielectric surface of the isolation structure 102 that is mainly made of silicon oxide ($SiO_2$). In some embodiments, the epitaxial layer 140 is grown on the surface of the adjustment region 130 in the active region AA that is made of silicon. In some embodiments, the epitaxial layer 140 is dopant-free silicon or pure silicon. In some embodiments, the epitaxial layer 140 has a top surface S3.

Figure 10:
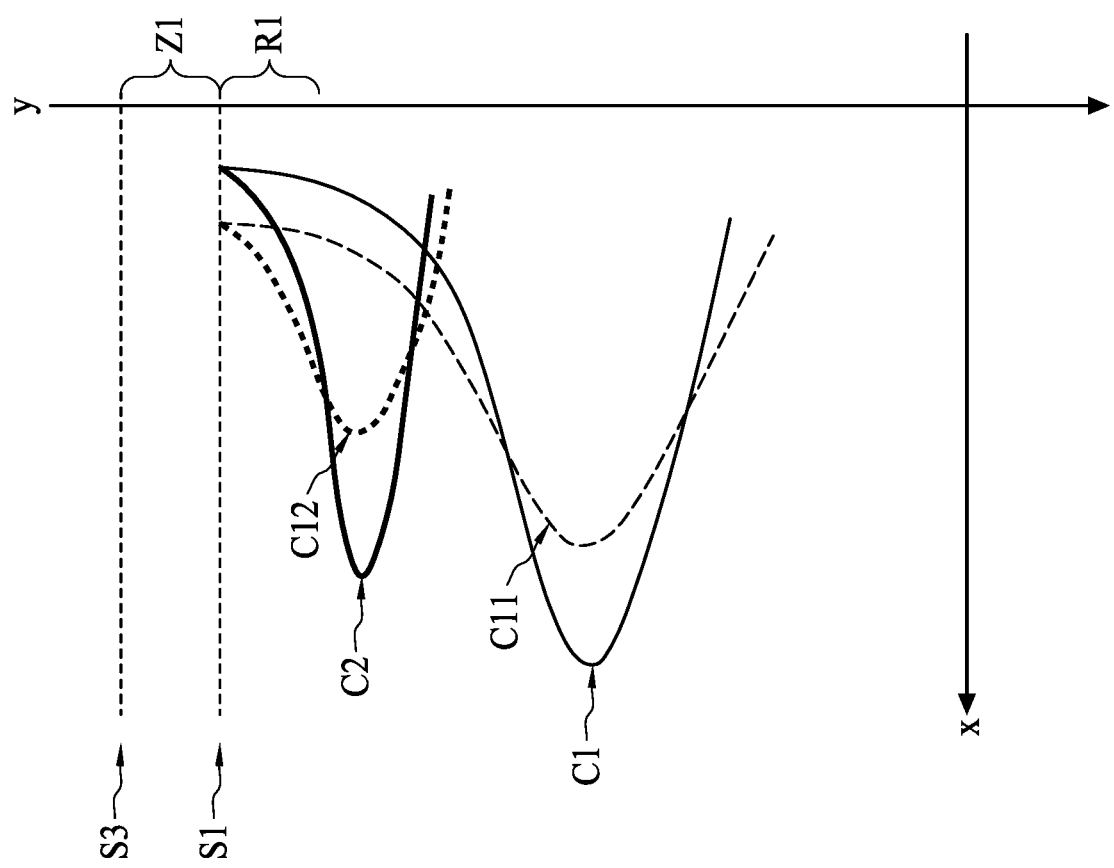

FIG. 10 is a schematic graph depicting concentrations of impurity atoms with respect to position in the substrate after the operation S109, in accordance with some embodiments of the present disclosure. In some embodiments, due to the addition of the epitaxial layer 140 on the adjustment region 130, a dopant-free region Z1 is present over the region R1, as shown in FIG. 10. In some embodiments, the dopant-free region Z1 is between the top surface S3 and the top surface S1 and the thickness of the dopant-free region Z1 is substantially the thickness of the epitaxial layer 140. In some embodiments, the dopant-free region Z1 has substantially zero concentration of impurity atoms.

In some embodiments, the epitaxial layer 140 can be used to separate doped regions (i.e., the adjustment region 130 and the well region 120) and a gate structure of a device subsequently formed over the epitaxial layer 140. Since the gate structure does not directly contact the doped region, the influence of impurity scattering on the gate structure is reduced. In such embodiments, the carrier mobility of the device can be decreased. In addition, a low power consumption and a large driving current can be achieved.

Figure 11:
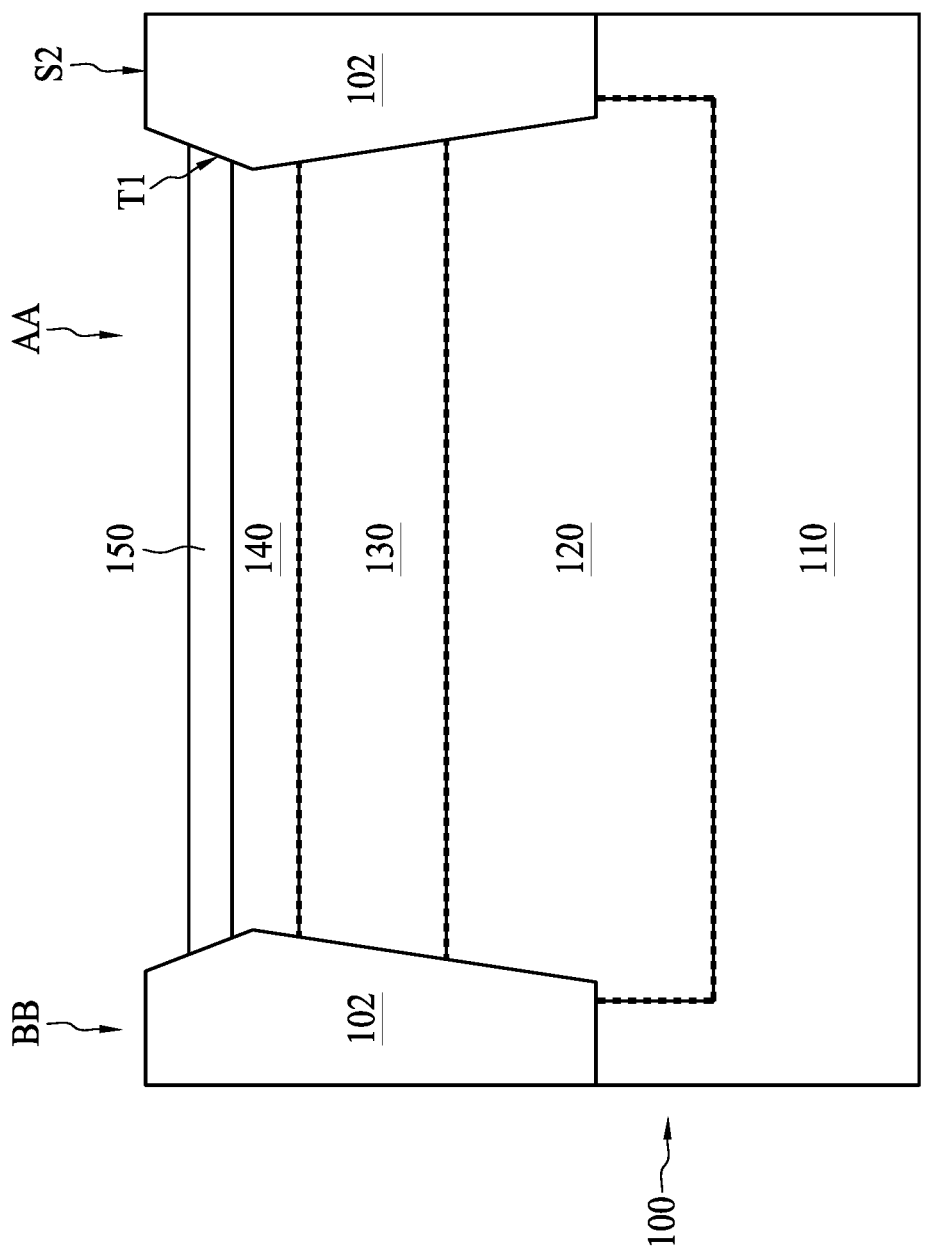

In operation S111, a gate dielectric 150 is formed in the active region AA as shown in FIG. 11. In some embodiments, the gate dielectric 150 includes oxide, thermally-grown silicon oxide ($SiO_2$), nitride, oxynitride, or a combination thereof. In some embodiments, the gate dielectric 150 is formed by changing a portion of the epitaxial layer 140 into a dielectric layer. For example, after the surface of the epitaxial layer 140 is cleaned through chemical treatment, a thermal oxidation or a rapid thermal process (RTP) may be performed to oxidize a top portion of the silicon-containing epitaxial layer 140 into silicon oxide ($SiO_2$). In some embodiments, the thermal oxidation is achieved by subjecting the substrate 100 to an oxygen-bearing environment such as an oxidation furnace or a rapid thermal annealing (RTA) system and heating the substrate 100 to a high temperature. In some embodiments, before the thermal oxidation, the thickness of the epitaxial layer 140 must be greater than a predetermined thickness of the gate dielectric 150 to be formed. During the thermal oxidation, about 40% to 60% of the thickness of the epitaxial layer 140 is oxidized to form the gate dielectric 150. In some embodiments, the thickness and quality of the gate dielectric 150 has a major effect on transistor performance and reliability, and thus the gate dielectric 150 must be a thin, high-density film with a uniform distribution.

Figure 12:
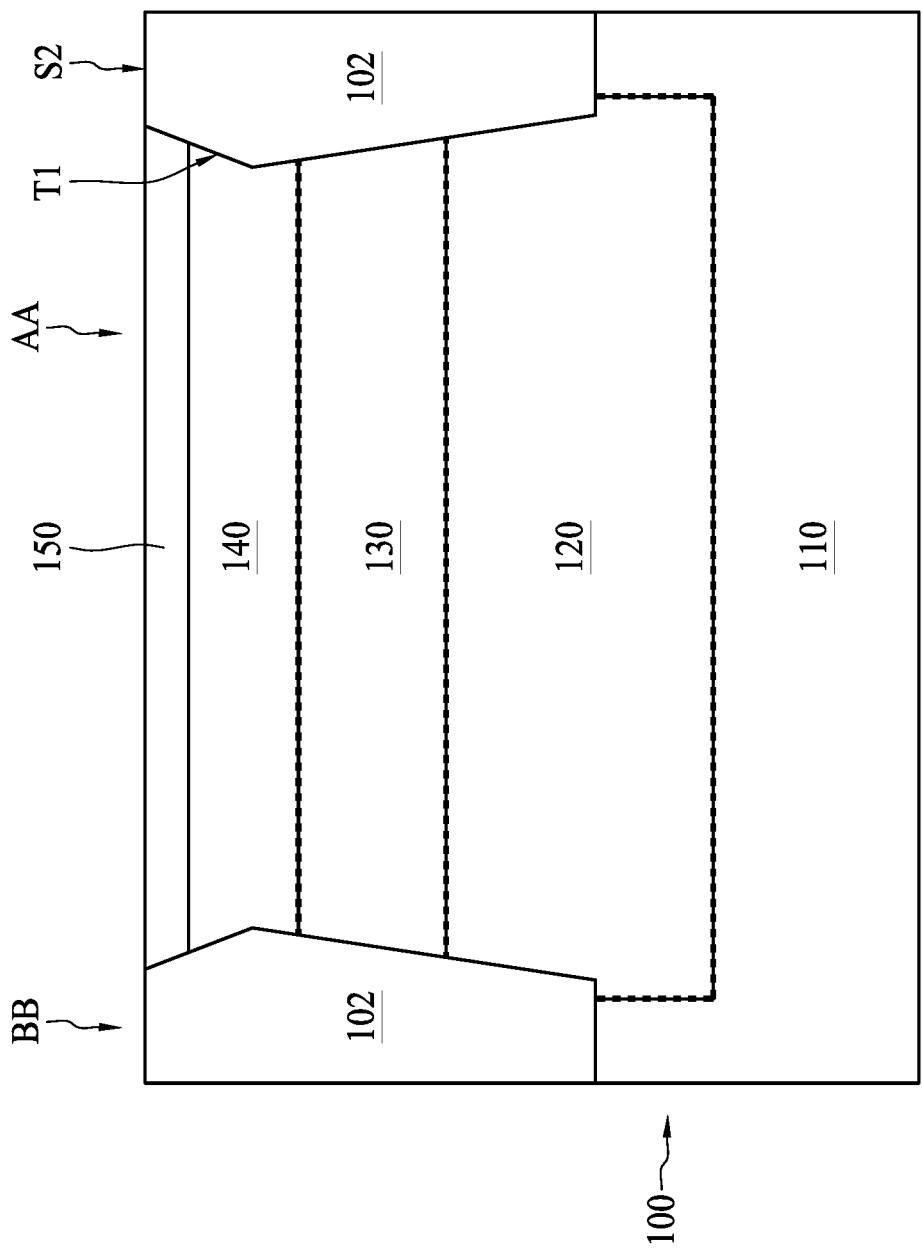

Referring to FIG. 12, in other embodiments, the gate dielectric 150 is formed by depositing silicon oxide ($SiO_1$) on the epitaxial layer 140. For example, a chemical vapor deposition (CVD) process may be performed to cover the active region AA and the isolation region BB with silicon oxide ($SiO_2$), followed by removing the silicon oxide ($SiO_2$) on the isolation region BB using a chemical mechanical polishing (CMP) process. In such embodiments, the formation of the gate dielectric 150 does not consume any of the epitaxial layer 140. In some embodiments, the gate dielectric 150 is formed with a thickness that is as small as possible, i.e., substantially less than the thickness of the epitaxial layer 140.

Figure 13:
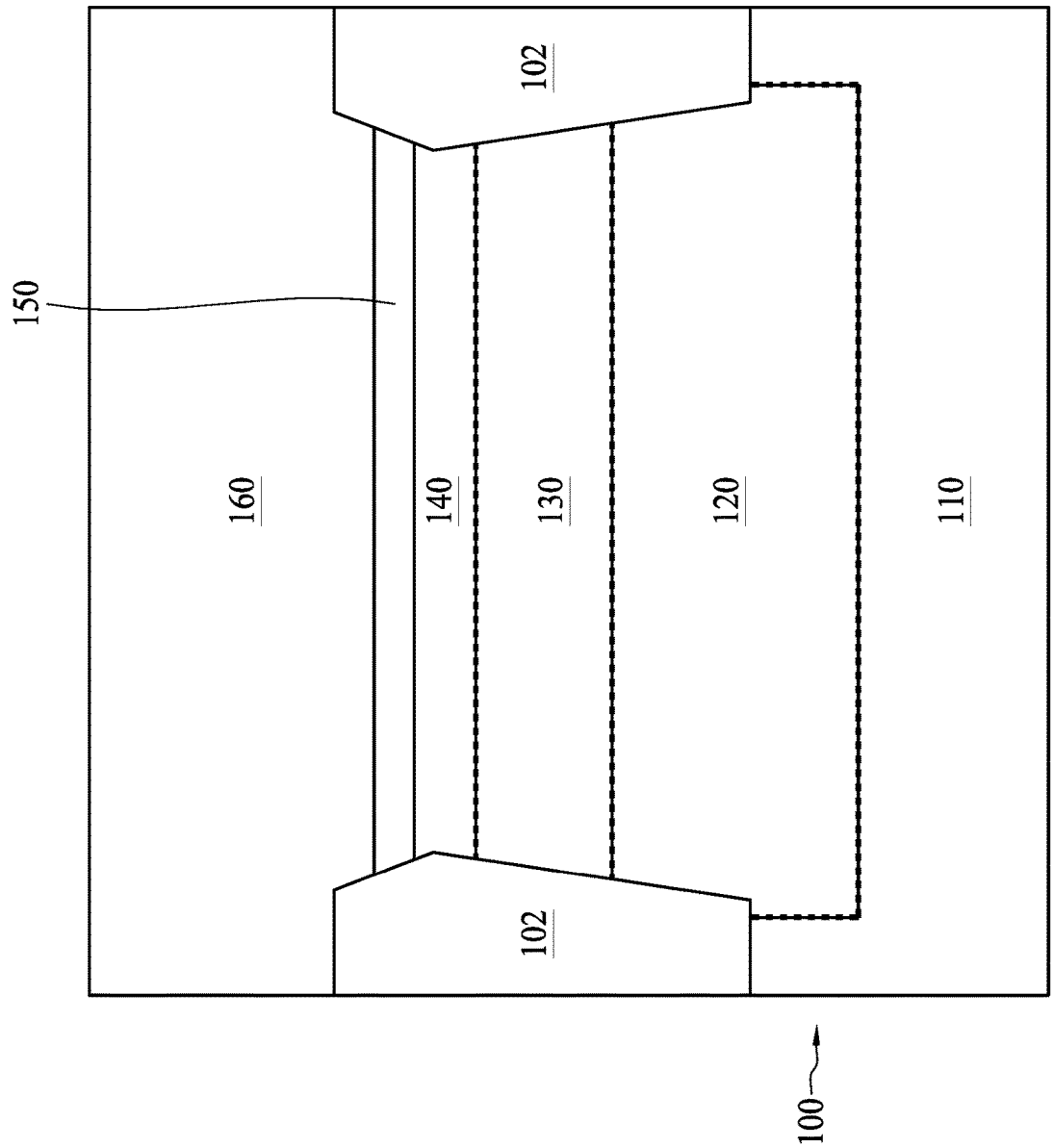

In operation S113, a gate conductor 160 is formed on the gate dielectric 150 as shown in FIG. 13. In some embodiments, the gate conductor 160 includes, but is not limited to, polycrystalline silicon (polysilicon) or high-k materials. In some embodiments, the method of forming the gate conductor 160 includes a CVD process such as a low-pressure chemical vapor deposition (LPCVD) process that forms polysilicon to cover the active region AA and the isolation region BB. In some embodiments, the gate conductor 160 may be formed with a dopant. In other embodiments, the gate conductor 160 may be dopant free.

Figure 14:
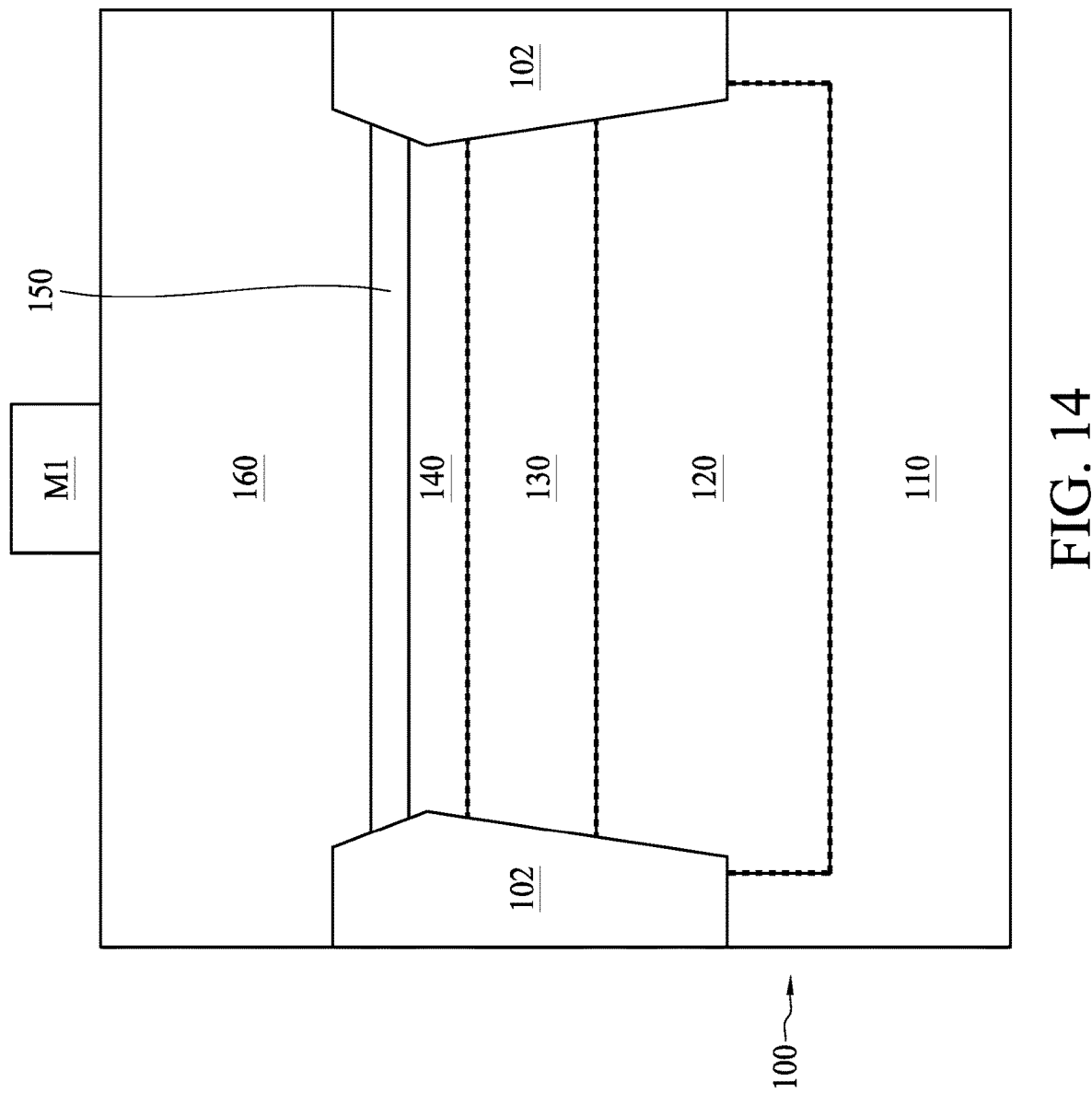
Figure 15:
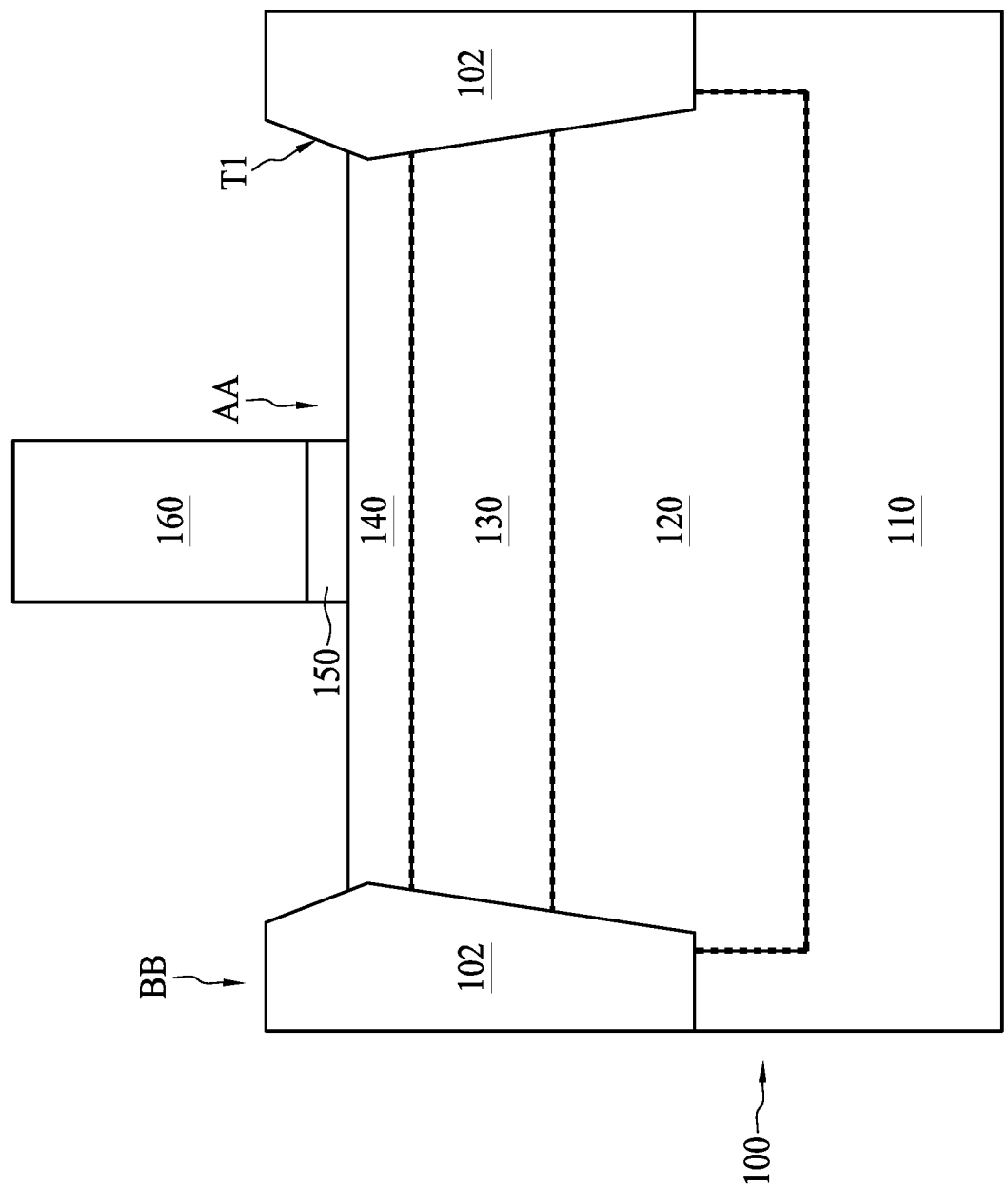

In operation S115, the gate conductor 160 and the gate dielectric 150 are patterned as shown in FIGS. 14 and 15. Referring to FIG. 14, in some embodiments, a photomask M1 is formed on the gate conductor 160. The photomask M1 may be formed using standard photolithographic processes. For example, a photoresist may be coated on the gate conductor 160, followed by a removal of the photoresist in selected areas to expose the underlying gate conductor 160. Referring to FIG. 15, exposed portions of the gate conductor 160 and the gate dielectric 150 are removed using a dry or plasma etch process. After the etch process, most of the gate conductor 160 and the gate dielectric 150 are removed, except for the portion beneath the photomask M1. The remaining portion of the gate conductor 160 and the gate dielectric 150 cover only a portion of the epitaxial layer 140.

Figure 16:
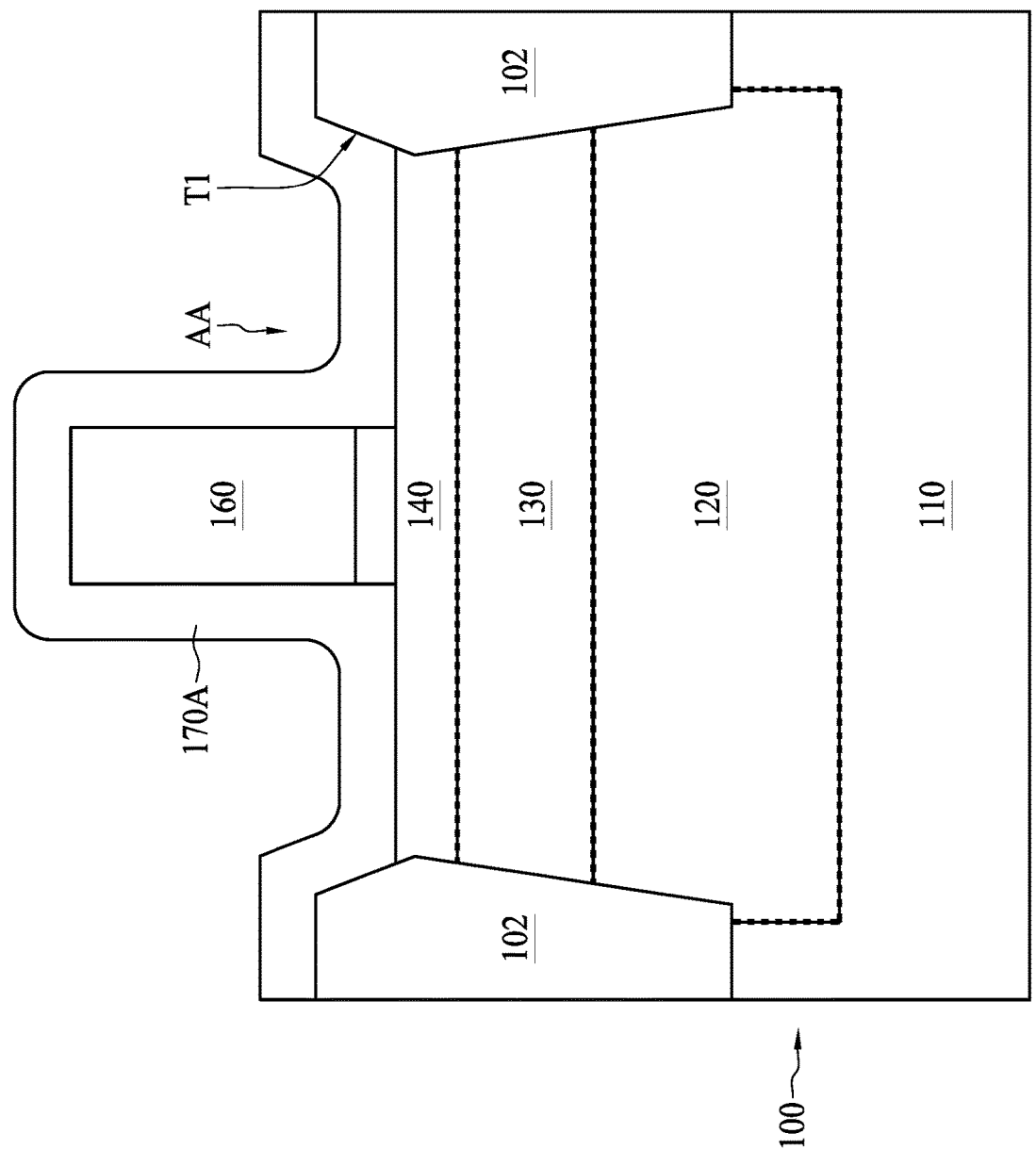
Figure 17:
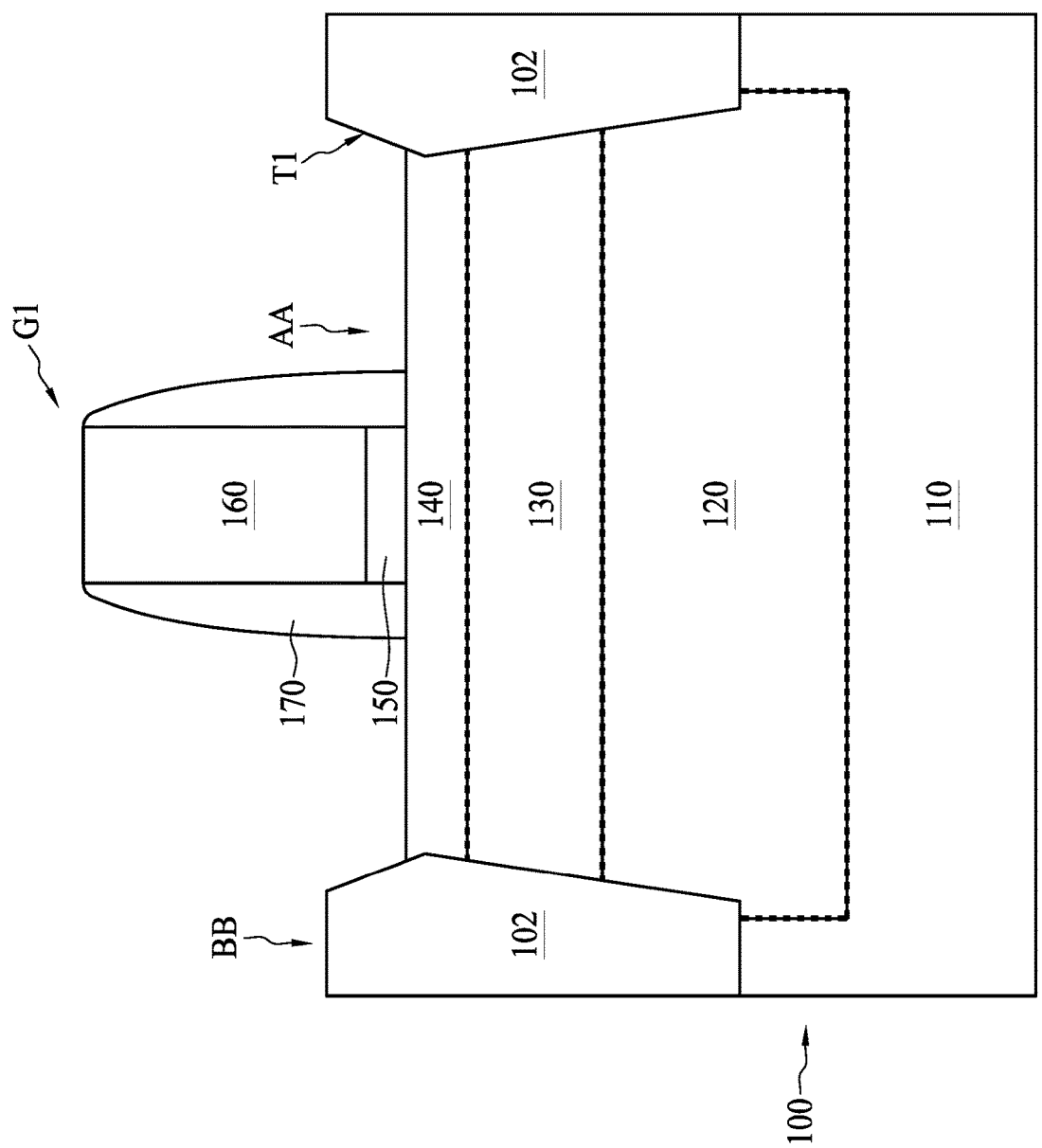

In operation S117, a gate spacer 170 is formed to surround the gate dielectric 150 and the gate conductor 160 as shown in FIGS. 16 and 17. Referring to FIG. 16, an oxide layer 170A is formed using a CVD process or an ALD process over the entire surface of the substrate 100. In some embodiments, the oxide layer 170A has a predetermined thickness and covers the profile of the gate conductor 160, which is on the gate dielectric 150. Referring to FIG. 17, an etch-back process is performed to remove most of the oxide layer 170A and form the gate spacer 170 which remains only on sidewalls of the gate dielectric 150 and the gate conductor 160. In some embodiments, the gate spacer 170 covers portions of the epitaxial layer 140. At such time, a gate structure G1 including the gate dielectric 150, the gate conductor 160 and the gate spacer 170 is formed.

Figure 18:
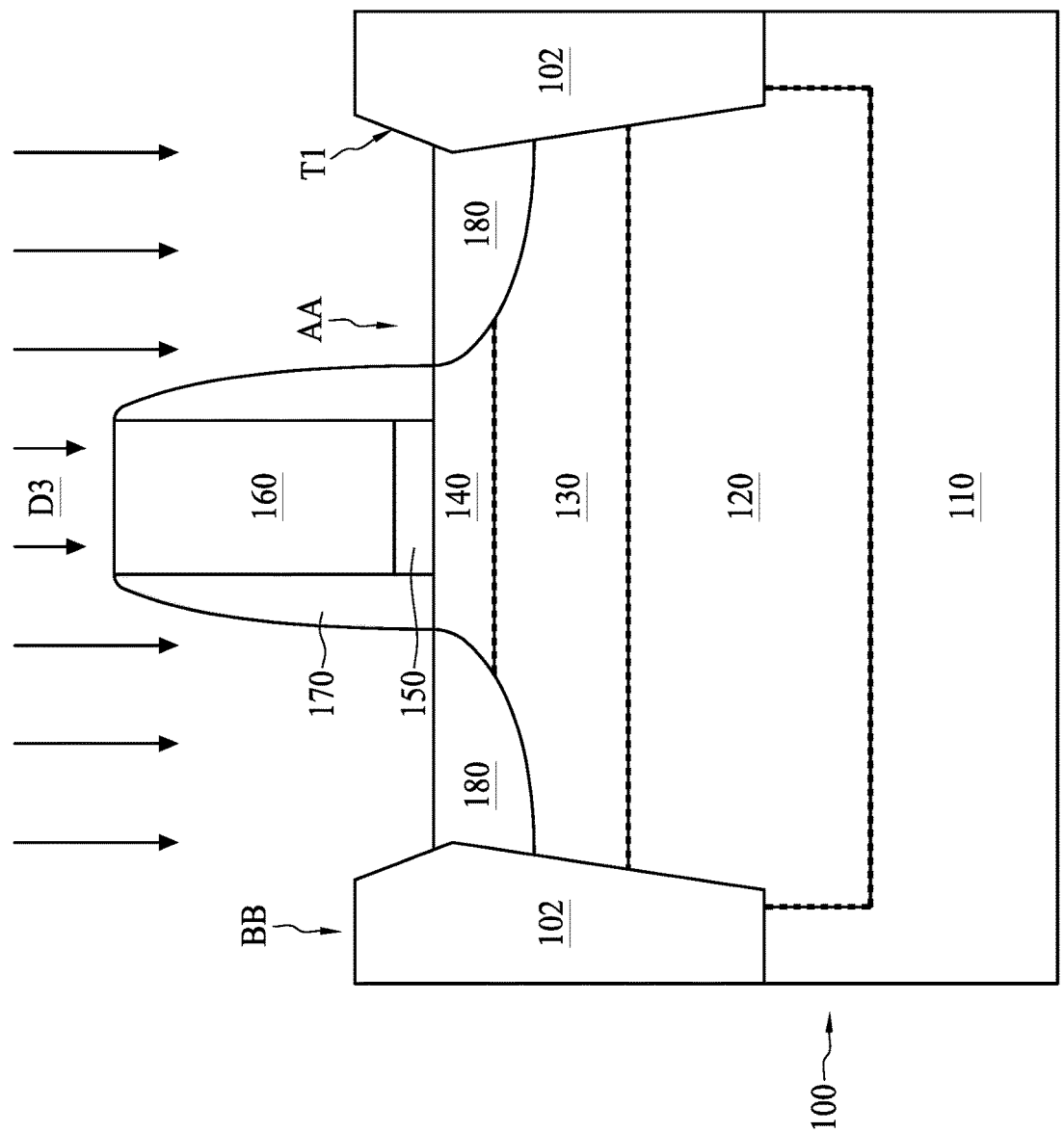

In operation S119, a third implantation is performed on the active region AA in the substrate 100 as shown in FIG. 18. Third dopant ions D3 may be implanted into the active region AA to form a source/drain (S/D) region 180. In some embodiments, the gate structure G1 serves as an implant mask which blocks portions of the dopant ions D3. The implant mask prevents the epitaxial layer 140 beneath the gate structure G1 form being implanted. In such embodiments, a portion of the epitaxial layer 140 is implanted with dopants while the portion of the epitaxial layer 140 beneath the gate structure G1 remains dopant free. In some embodiments, the portion of the epitaxial layer 140 beneath the gate structure G1 has substantially the same concentration of impurity atoms as the bulk region 110. In some embodiments, the dopant-free epitaxial layer 140 is surrounded by the S/D region 180 that is surrounded by the isolation region BB. In some embodiments, the S/D region 180 extends longitudinally from the top surface of the epitaxial layer 140 to a predetermined depth of the adjustment region 130. For example, the bottom-most surface of the S/D region 180 may be positioned about halfway between top and bottom surfaces of the adjustment region 130. In some embodiments, the S/D region 180 may include portions of the epitaxial layer 140 and the adjustment region 130. In other embodiments, the S/D region 180 is disposed in portions of the epitaxial layer 140.

In some embodiments, the S/D region 180 is disposed on opposite sides of the gate structure G1. The gate spacer 170 may separate the S/D region 180 from the gate dielectric 150 and the gate conductor 160. In some embodiments, when the well region 120 is a p-type well, the third dopant ions D3 including n-type dopant ions are used. In such embodiments, the S/D region 180 becomes an n-type region and an NMOS transistor is to be formed. In some embodiments, when the well region 120 is an n-type well, the third dopant ions D3 including p-type dopant ions are used. In such embodiments, the S/D region 180 becomes a p-type region and a PMOS transistor is to be formed. At such time, a semiconductor structure P10 in FIG. 1 is formed. In some embodiments, the semiconductor structure P10 is substantially a transistor in which the gate structure G1 serves as a gate terminal of the transistor and the S/D region 180 serves as a source terminal and a drain terminal of the transistor. In some embodiments, a channel region (not shown) is between the S/D region 180 and at an interface of the epitaxial layer 140 and the gate dielectric 150. Since the channel region substantially includes dopant-free silicon, impurity scattering does not have a significant influence on the carrier mobility at the channel region. In some embodiments where multiple transistors are formed, the S/D region 180 may be shared between various transistors. In some embodiments, multiple neighboring S/D regions 180 may be electrically connected, such as through coupling the S/D regions 180 with a source drain contact.

One aspect of the present disclosure provides a semiconductor structure. The semiconductor structure includes a substrate including a well region and an adjustment region over the well region. An isolation structure is disposed over the substrate and at least partially surrounds the well region and the adjustment region. An epitaxial layer is disposed over the adjustment region and surrounded by the isolation structure. A gate structure is disposed on the epitaxial layer.

In some embodiments, the gate structure includes a gate dielectric on the epitaxial layer, a gate conductor on the gate dielectric and a gate spacer surrounding the gate dielectric and the gate conductor.

In some embodiments, the epitaxial layer includes dopant-free silicon.

In some embodiments, the well region and the adjustment region include impurity atoms.

In some embodiments, the epitaxial layer is in direct contact with the gate dielectric and the gate spacer.

In some embodiments, the epitaxial layer has a thickness of about 15 to about 60 angstroms (Å) and the thickness of the epitaxial layer is substantially greater than a thickness of the gate dielectric.

Another aspect of the present disclosure provides a semiconductor structure. The semiconductor structure includes a substrate including a bulk region. A well region is disposed over the bulk region. An isolation structure is disposed over the bulk region and at least partially surrounds the well region. An epitaxial layer is disposed over the well region and surrounded by the isolation structure. A gate structure is disposed on the epitaxial layer.

In some embodiments, the gate structure includes a gate dielectric and a gate spacer covering the epitaxial layer.

In some embodiments, a portion of the epitaxial layer beneath the gate structure has substantially the same concentration of impurity atoms as the bulk region.

In some embodiments, the bulk region and the epitaxial layer are free of impurity atom, and the well region includes impurity atoms.

In some embodiments, the semiconductor structure further comprises a source/drain region disposed in portions of the epitaxial layer and at opposite sides of the gate structure.

In some embodiments, a portion of the epitaxial layer surrounded by the source/drain region includes dopant-free silicon.

Another aspect of the present disclosure provides a method tier fabricating a semiconductor structure. The method comprises providing a substrate; forming an isolation structure to surround at least a portion of the substrate; performing a first implantation on the substrate to form a well region in the substrate; performing a second implantation on the substrate to form an adjustment region over the well region; growing an epitaxial layer over the adjustment region; and forming a gate structure on the epitaxial layer.

In some embodiments, the second implantation is performed after the first implantation.

In some embodiments, the method further comprises performing an annealing after the first implantation or the second implantation.

In some embodiments, the growth of the epitaxial layer comprises forming dopant-free silicon over the substrate.

In some embodiments, the formation of the gate structure comprises forming a gate dielectric over the epitaxial layer; forming a gate conductor on the gate dielectric; and removing portions of the gate dielectric and the gate conductor.

In some embodiments, the formation of the gate dielectric includes oxidizing a portion of the epitaxial layer distal to the substrate.

In some embodiments, the formation of the gate dielectric includes depositing an oxide on the epitaxial layer.

In some embodiments, the method further comprises forming a gate spacer surrounding the gate dielectric and the gate conductor, and covering at least a portion of the epitaxial layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

The invention claimed is:

1. A semiconductor structure, comprising:
    a substrate including a well region and an adjustment region over the well region;
    an isolation structure disposed over the substrate and at least partially surrounding the well region and the adjustment region;
    an epitaxial layer disposed over the adjustment region and surrounded by the isolation structure; and
    a gate structure disposed on the epitaxial layer, wherein the gate structure includes a gate spacer contacting the epitaxial layer.

2. The semiconductor structure of claim 1, wherein the gate structure includes a gate dielectric on the epitaxial layer, a gate conductor on the gate dielectric and the gate spacer surrounds the gate dielectric and the gate conductor.

3. The semiconductor structure of claim 2, wherein the epitaxial layer has a thickness of about 15 to about 60 angstroms (Å) and the thickness of the epitaxial layer is substantially greater than a thickness of the gate dielectric.

4. The semiconductor structure of claim 1, wherein the epitaxial layer includes dopant-free silicon.

5. The semiconductor structure of claim 1, wherein the well region and the adjustment region include impurity atoms.

6. The semiconductor structure of claim 1, wherein the epitaxial layer is in direct contact with the gate dielectric.

7. A semiconductor structure, comprising:
    a substrate including a bulk region and a well region disposed over the bulk region;
    an isolation structure disposed over the bulk region and at least partially surrounding the well region;
    an epitaxial layer disposed over the well region and surrounded by the isolation structure; and
    a gate structure disposed on the epitaxial layer, wherein the gate structure includes a gate spacer contacting the epitaxial layer.

8. The semiconductor structure of claim 7, wherein the gate structure includes a gate dielectric over the epitaxial layer.

9. The semiconductor structure of claim 7, wherein a portion of the epitaxial layer beneath the gate structure has substantially same concentration of impurity atoms as the bulk region.

10. The semiconductor structure of claim 7, wherein the bulk region and the epitaxial layer are free of impurity atom, and the well region includes impurity atoms.

11. The semiconductor structure of claim 7, further comprising a source/drain region disposed in portions of the epitaxial layer and at opposite sides of the gate structure.

12. The semiconductor structure of claim 11, wherein a portion of the epitaxial layer surrounded by the source/drain region includes dopant-free silicon.

13. A method for fabricating a semiconductor structure, comprising:
    providing a substrate;
    forming an isolation structure to surround at least a portion of the substrate;
    performing a first implantation on the substrate to form a well region in the substrate;
    performing a second implantation on the substrate to form an adjustment region over the well region;
    growing an epitaxial layer over the adjustment region; and
    forming a gate structure on the epitaxial layer, wherein the forming of the gate structure includes forming a gate spacer contacting the epitaxial layer.

14. The method of claim 13, wherein the second implantation is performed after the first implantation.

15. The method of claim 13, further comprising performing an annealing after the first implantation or the second implantation.

16. The method of claim 13, wherein the growth of the epitaxial layer comprises forming dopant-free silicon over the substrate.

17. The method of claim 13, wherein the formation of the gate structure comprises:
    forming a gate dielectric over the epitaxial layer;
    forming a gate conductor on the gate dielectric; and
    removing portions of the gate dielectric and the gate conductor.

18. The method of claim 17, wherein the formation of the gate dielectric includes oxidizing a portion of the epitaxial layer distal to the substrate.

19. The method of claim 17, wherein the formation of the gate dielectric includes depositing an oxide on the epitaxial layer.

20. The method of claim 13, wherein the gate spacer surrounds the gate dielectric and the gate conductor.

* * * * *